US010963429B2

(12) United States Patent
McElveen

(10) Patent No.: US 10,963,429 B2
(45) Date of Patent: Mar. 30, 2021

(54) METHOD AND SYSTEM FOR CONTENT AGNOSTIC FILE INDEXING

(71) Applicant: LOGNOVATIONS HOLDINGS, LLC, Tampa, FL (US)

(72) Inventor: Christopher McElveen, Tampa, FL (US)

(73) Assignee: LOGNOVATIONS HOLDINGS, LLC, Tampa, FL (US)

( * ) Notice: Subject to any disclaimer, the term of this patent is extended or adjusted under 35 U.S.C. 154(b) by 114 days.

(21) Appl. No.: 15/730,043

(22) Filed: Oct. 11, 2017

(65) Prior Publication Data

US 2019/0108237 A1  Apr. 11, 2019

(51) Int. Cl.
*G06F 7/02* (2006.01)
*G06F 16/00* (2019.01)
*G06F 16/174* (2019.01)
*G06F 16/13* (2019.01)
*G06F 16/22* (2019.01)

(52) U.S. Cl.
CPC .......... *G06F 16/1744* (2019.01); *G06F 16/13* (2019.01); *G06F 16/2237* (2019.01)

(58) Field of Classification Search
CPC ....... H04L 9/065; H04L 69/04; H04L 9/0631; G06F 16/2237; H03M 7/30; H03M 7/60; H03M 7/55
See application file for complete search history.

(56) References Cited

U.S. PATENT DOCUMENTS

| 4,168,513 | A | 9/1979 | Hains et al. |
| 5,003,597 | A | 3/1991 | Merkle |
| 5,442,350 | A | 8/1995 | Iyer et al. |
| 5,486,826 | A | 6/1996 | Remillard |
| 5,594,435 | A | 1/1997 | Remillard |
| 5,673,042 | A | 9/1997 | Yoshida et al. |
| 5,937,183 | A | 8/1999 | Ashar et al. |
| 6,633,244 | B2 | 10/2003 | Avery et al. |
| 6,785,859 | B2 | 8/2004 | Goldman |

(Continued)

FOREIGN PATENT DOCUMENTS

| CN | 1977540 | 6/2007 |
| CN | 107135062 A | 9/2017 |

(Continued)

OTHER PUBLICATIONS

Bowe, Alex, "Generating Binary Permutations in Popcount Order," May 9, 2011 taken from https://alexbowe.com/popcount-permutations/ on Dec. 8, 2020. (Year: 2011).*

(Continued)

*Primary Examiner* — Bruce M Moser
(74) *Attorney, Agent, or Firm* — Carr & Ferrell LLP

(57) ABSTRACT

A computer-implemented method for content-agnostic referencing of a binary data file, the method comprising: determining a length of the binary data file, the length comprising the number of bits of the binary data file; for the determined length, generating all permutations of data of the determined length; locating an index within the generated permutations, wherein the index is the starting position of the binary data file within the generated permutations; and using the length and the index to indicate the binary data file.

20 Claims, 2 Drawing Sheets

(56) References Cited

U.S. PATENT DOCUMENTS

| | | |
|---|---|---|
| 7,636,724 B2 | 12/2009 | de la Torre et al. |
| 7,809,765 B2 | 10/2010 | Evans et al. |
| 7,868,788 B2 | 1/2011 | Au et al. |
| RE43,292 E | 4/2012 | Parker |
| 8,521,540 B2 | 8/2013 | Burns et al. |
| 9,086,955 B2 | 7/2015 | Jiang et al. |
| 9,124,295 B2* | 9/2015 | Dupont .................. H03M 7/42 |
| 9,275,250 B2 | 3/2016 | Yoshino et al. |
| 9,331,851 B2 | 5/2016 | Youn et al. |
| 9,374,220 B2 | 6/2016 | Youn et al. |
| 10,135,462 B1 | 11/2018 | Wallace et al. |
| 2006/0244639 A1 | 11/2006 | Parker |
| 2009/0063930 A1 | 3/2009 | Matsumoto et al. |
| 2009/0319536 A1 | 12/2009 | Parker |
| 2011/0125727 A1 | 5/2011 | Zou et al. |
| 2012/0166448 A1 | 6/2012 | Li et al. |
| 2015/0086013 A1 | 3/2015 | Metzler et al. |
| 2015/0201043 A1 | 7/2015 | Sulieman et al. |
| 2017/0192747 A1* | 7/2017 | Nakamura .............. G06F 7/491 |
| 2019/0146950 A1 | 5/2019 | McElveen |
| 2019/0191372 A1 | 6/2019 | Murali et al. |

FOREIGN PATENT DOCUMENTS

| | | |
|---|---|---|
| CN | 108667595 A | 10/2018 |
| CN | 108924552 A | 11/2018 |
| GB | 2017006103 | 1/2017 |
| GB | 2017064457 | 4/2017 |
| WO | WO2013024230 A2 | 2/2013 |
| WO | WO2017006103 A1 | 1/2017 |
| WO | WO2017064457 A1 | 4/2017 |
| WO | WO2019075175 A1 | 4/2019 |

OTHER PUBLICATIONS

Tatsuya Ohno, Yoshimasa Takabatake, Tomohiro I, and Hiroshi Sakamoto, A Faster Implementation of Online Run-Length Burrows-Wheeler Transform.

Francois Nicolas, A Simple, polynomial-time algorithm for the matrix torsion problem, Sep. 9, 2009.

H Weyl, Gravitation and Electricity, Sitzungsber. Preuss. Akad. Berlin (1918) 465.

Andrew Granville, Harald Cramer and the Distribution of Prime Numbers, Athens, Georgia.

Guilio Chiribella, Giacomo Mauro D'Ariano and Paulo Perinotti, Informational Derivation of Quantum Theory, Ontario, Canada, and Pavia Italy, Jul. 18, 2011.

Rituparno Goswami and Pankaj S Joshi, Naked Singularity Formation in Scalar Field Collapse, India.

Youngju Choie, Michel Planat, and Patrick Sole, On Nicolas Criterion for the Riemann Hypothesis.

Gary L Miller, Riemann's Hypothesis and Tests for Primality, Ontario Canada, Jan. 30, 1967.

James Maynard, Small Gaps Between Primes.

Elchin Hasanalizade, The Goldston-Pintz-Yildirim Sieve and Some Applications, Dec. 14, 2012.

Bruce C Berndt, Winfried Kohnen, and Ken Ono, The Life and Word of R.A. Rankin (1915-2001).

Sebastian Deorowicz, Universal Lossless Data Compression Algorithms, Gliwice, 2003.

Yi-Fang Chang, Various Decays of Particles, Universal Decay Formulas and Their Possible Dynamic Basis and Applications, China.

Robert Sedgewick, Permutation Generation Methods, Princeton University.

Lei Tang, Methods for Encrypting and Decrypting MPEG Video Data Efficiently, Carnegie Mellon University, Pittsburgh, PA.

Jiantao Zhou, Oscar C. Au, Xiaopeng Fan, and Peter Hon-Wah Wong, Secure Lempel-Ziv-Welch (LZW) Algorithm with Random Dictionary Insertion and Permutation, Hong Kong University of Science and Technology, Clear Water Bay, Hong King, China.

Pingpeng Yuan, Pu Liu, Buwen Wu, Hai Jin, Wenya Zhang, and Ling Liu, TripleBit: a Fast and Compact System for Large Scale RDF Data, Huazhong University of Science and Technology, China, and Georgia Institute of Technology, USA.

Burrows-Wheeler Transform, CMSC 423.

SW Hawking, Properties of Expanding Universes, University of Cambridge.

Jacob Ziv and Abraham Lempel, A Universal Algorithm for Sequential Data Compression, May 1977.

Jorma Rissanen, A Universal Data Compression System, Sep. 1983.

Mohamed Abdel-Maguid and Mansour Moniri, Efficient Processing of Binary Shape Masks in the Compressed Domain Using Generalized Finite Transducers.

"International Search Report" and "Written Opinion of the International Searching Authority" Patent Cooperation Treaty Application No. PCT/US2020/012661, Apr. 21, 2020. 7 pages.

Canteaut, Anne et al., "Stream ciphers: A practical solution for efficient homomorphic-ciphertext compression", Journal of Cryptology 31.3 (2018): 885-916.

Ziv, Jacob et al., "A universal algorithm for sequential data compression", IEEE Transactions on information theory 23.3 (1977): 337-343.

Coron, Jean-Sébastien et al., "Public key compression and modulus switching for fully homomorphic encryption over the integers", Annual International Conference on the Theory and Applications of Cryptographic Techniques, Springer, Berlin, Heidelberg, 2012.

Paolo Ferragina, Giovanni Manzini, Veli Makinen, Gonzalo Navarro, Compressed Representation of Sequences and Full-Text Indexes, 2007.

Yedidya Hilewitz and Ruby B Lee, Fast Bit Compression and Expansion with Parallel Extract and Parallel Deposit Instructions.

Navarro, Gonzalvo, "A Guided Tour to Approximate String Matching," ACM Computing Surveys, 1999, 68 pages.

Faro, Simone et al., "Efficient Pattern Matching on Binary Strings," Current Trends in Theory and Practice of Computer Science, 2009, 4 pages.

* cited by examiner

METHOD AND SYSTEM FOR CONTENT AGNOSTIC FILE INDEXING

TECHNICAL FIELD

This disclosure relates to a method for content agnostic file referencing. The method may further relate to a method for content agnostic data compression.

BACKGROUND OF THE INVENTION

File referencing techniques generally require knowledge about the kind of data being stored in order to efficiently index the data in a file referencing system. Similarly, knowledge about the data at issue is also generally used in creating improved compression approaches to reduce data size for transmission, storage, and the like.

There exists a need in the industry to improve file referencing and data compression techniques to reduce the amount of data that must be stored and/or transmitted.

SUMMARY OF THE INVENTION

According to one embodiment, this disclosure provides a method for improving computing technology with an enhanced content-agnostic file referencing system.

The disclosed method has several important advantages. For example, the disclosed method permits file referencing of any content type.

The disclosed method additionally permits a significant reduction in the amount of information or data that must be persisted or transmitted, as data may be generated at access time as opposed to persisted.

Various embodiments of the present disclosure may have none, some, or all of these advantages. Other technical advantages of the present disclosure may also be readily apparent to one skilled in the art.

BRIEF DESCRIPTION OF THE DRAWINGS

For a more complete understanding of the present disclosure and its advantages, reference is now made to the following descriptions, taken in conjunction with the accompanying drawings, in which.

Similar reference numerals refer to similar parts or steps throughout the several views of the drawings.

DETAILED DESCRIPTION OF THE EMBODIMENTS

The present disclosure relates to a method for content-agnostic indexing of data. The method may be used for a variety of computer-specific needs, including for example as a file referencing system or a compression system.

The disclosure below describes the invention in connection with compression of binary data as exemplary, but the teachings work as well with any type of data, better termed "n-ary" data. For example, the method and system also works with qubits and bits.

Figure 1:
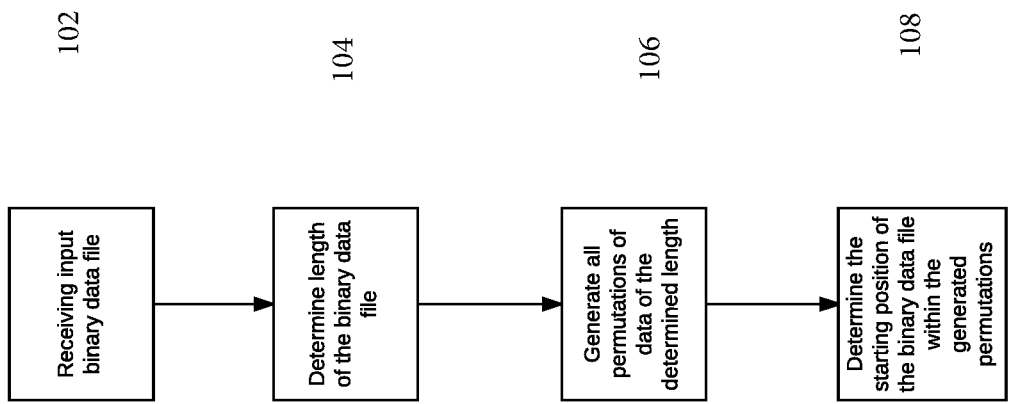
FIG. 1 is a flowchart outlining the steps of one embodiment of the present disclosure.

One embodiment of the present invention comprises a method as described in the flow chart depicted in FIG. 1. Binary data ($n_i$) (for instance, a data file) to be persisted or transmitted is analyzed to determine its length in bits (step 104) ($l(n_i)$). Using this information, at step 106, the method calculates all permutations of data of the identified length. For example, if the input data is:

then the input data is 2-bits long. At step 106, all permutations of 2-bits will be generated, namely:

{00} {01} {10} {11}

At step 108, the method determines the index ($n_f$) of the input binary data file in the generated permutations. Using the example above, the index ($n_f$) returned would be "1". Finally, rather than storing or transmitting the input binary data (i.e. "01"), the system instead stores the length (2) and the index (1).

Figure 2:
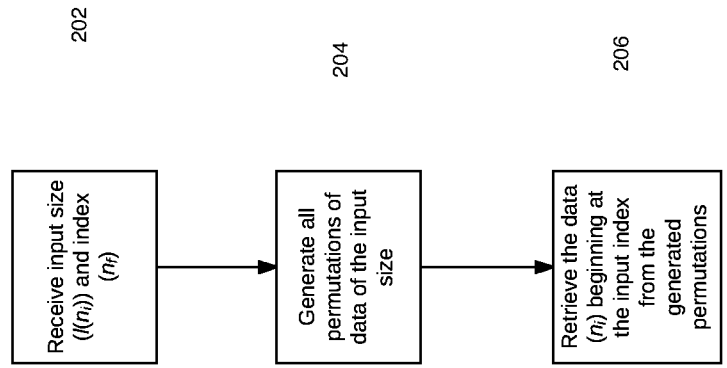
FIG. 2 is another flowchart outlining the steps of another embodiment of the present disclosure.

When the need comes to decode the original input data (for instance, a request to retrieve the original binary data from disk, or receipt of the transmitted data across a network), the method needs only a length ($l(n_i)$) and an index ($n_f$) as input (step 202). Using the above example, the input provided would be the length (2) and the index (1). As shown in FIG. 2, the system calculates all permutations of the inputted length (step 204). As above, that would generate the following permutations:

{00} {01} {10} {11}

The system would then go to the provided index (1 in the above example) and return the permutation (step 206). Again, using the above example, this would return "01" the original binary data.

The above method has been described for purposes of example in terms of a binary system (i.e. the input data is binary data). The method and system work similarly for n-ary systems. While the binary system describes above works essentially in the Euclidean plane, with n-ary data Hilbert spaces conceptually provide the same advantages. The method and process can be generalized for n-ary data per below:

$$d^{\wedge}n = p(i)$$

$$(d^{\wedge}n)n = p(f)$$

d=order of the system
n=length in appropriate n-ary units respective to the order of the system
p(i)=initial index
p(f)=final index

| Order of System (d) | Visual Representation | Reference Key | Search Pattern |
|---|---|---|---|
| 1 | String | n/x | Left to Right |
| 2 | Plane | n/x/y | Top Left to Bottom Right |
| 3 | 3(fold) | n/x/y/z | Top Back Left to Bottom Front Right |
| D | D(fold) | n/x/y/z/ . . . | Top Back Left . . . to Bottom Front Right . . . |

It should be noted that given two alternative ordered systems with the same input file, the system with the higher order will have a higher n-ary density relative to the alternative with a lesser ordered system.

An example of the method is disclosed in the following Ruby code snippets. The below snippet demonstrates a method as disclosed in FIG. 1:

```
class Input
    require 'securerandom'
```

```
    def create(k)
      input_binary = SecureRandom.hex(k)
    end
    def clean(k)
      input_string = create(k).unpack('B*').first.to_s
    end
    def build(n)
      permutation = (0..2**n-1).map { |i| "%0#{n}b" % i }
    end
    def self.kmp_search(string, substring)
      return nil if string.nil? or substring.nil?
      pos = 2
      cnd = 0
      failure_table = [-1, 0]
      while pos < substring.length
        if substring[pos - 1] == substring[cnd]
          failure_table[pos] = cnd + 1
          pos += 1
          cnd += 1
        elsif cnd > 0
          cnd = failure_table[cnd]
        else
          failure_table[pos] = 0
          pos += 1
        end
      end
      m = i = 0
      while m + i < string.length
        if substring[i] == string[m + i]
          i += 1
          return m if i == substring.length
        else
          m = m + i - failure_table[i]
          i = failure_table[i] if i > 0
        end
      end
      return nil
    end
    def kmp_search(substring)
      Input.kmp_search(self, substring)
    end
  end
  init      = Input.new
  input     = init.clean(1)
  depth     = input.length
  generate  = init.build(depth)
  steps     = generate.join.to_s
  step      = Input.kmp_search("#{steps}" ,"#{input}")
  p input
  p depth
  p step
```

The below snippet demonstrates a method as disclosed in FIG. 2, using an input length (l($n_i$)) of 16 and an index ($n_j$) of 72,629:

```
  class Output
    def build(n)
      permutation = (0..2**n-1) .map { |i| "%0#{n}b" % i }
    end
  end
  depth      = 16
  step       = 72629
  init       = Output.new
  create     = init.build(depth)
  interpret  = create.join.to_s
  compute    = (depth + step) - 1
  output     = interpret[step..compute] .gsub (/\s\w+$/,'...')
  p output
```

The method and system may preferably be implemented in a computing system, which can include a personal computer, a workstation, a network computer, a hand held computer, or any other computing system. Further, the system may be written as a software program in any appropriate computer language.

The system includes one or more processing devices, which may be any computer processing unit, and could be a single central processing unit, or a number of processing units configured to operate either in sequence or in parallel. The processing device can be configured to execute software processes which implement the steps disclosed herein. The system may also include a memory capable of storing the steps necessary for a processing device to implement the steps disclosed herein. This memory could be in the form of memory resident within the processing device or in the form of standalone memory coupled to the processing unit via a communication path, such as a bus or a network.

Although this disclosure has been described in terms of certain embodiments and generally associated methods, alterations and permutations of these embodiments and methods will be apparent to those skilled in the art. Accordingly, the above description of example embodiments does not constrain this disclosure. Other changes, substitutions, and alterations are also possible without departing from the spirit and scope of this disclosure.

What is claimed is:

1. A computer-implemented method for content-agnostic referencing of a binary data file, the method comprising:
   determining, by a computer processor, an input size length of the binary data file, the input size length comprising the total number of bits of the binary data file;
   generating a random number, based on the determined input size length of the binary data file;
   converting the random number into a random binary string;
   based on the determined input size length of the binary data file, generating, by the computer processor, all permutations of data of the determined input size length in a predetermined order;
   generating a table, based on the permutations of data of the determined input size length in the predetermined order;
   locating the random binary string in the table;
   determining an index of the binary data file in the generated permutations of data, based on the located random binary string;
   storing the input size length and the index, in a memory coupled to the computer processor;
   upon receiving a request for input binary data of the binary data file and using the input size length and the index, locating the index within the generated permutations of data, via the computer processor, wherein the index is the starting position of the binary data file within the generated permutations, such that the located input binary data may be generated at access time; and
   providing the located input binary data in response to the request.

2. The method of claim 1, wherein the input size length and the index persist on the memory, instead of the binary data file.

3. The method of claim 1, wherein using the input size length and the index comprises:
   transmitting the input size length and the index to a recipient instead of the data file.

4. The method of claim 3 wherein transmitting transmits the input size length and the index on a network.

5. The method of claim 3 wherein transmitting transmits the input size length and the index on a bus.

6. The method of claim 1, wherein the generated permutations of data are not stored in the memory and are generated during each compression cycle.

7. A method of compressing a data file comprising a sequence of bytes, the method comprising:
  determining, by a computer processor, an input size length of the data file, the input size length comprising the total number of bytes in the data file;
  generating a random number, based on the determined input size length of the data file;
  converting the random number into a random binary string;
  based on the determined input size length of the data file, generating, in a predetermined order, all possible permutations of data of the determined input size length of the number of bytes using the computer processor;
  generating a table, based on the permutations of data of the determined input size length in the predetermined order;
  locating the random binary string in the table;
  searching through the generated permutations of data to locate the permutation that matches the data file using the computer processor;
  determining an index of the located permutation in the generated permutations of data, based on the located random binary string;
  storing the input size length and the index, in a memory coupled to the computer processor;
  upon receiving a request for input data of the data file and using the input size length and the index, locating the index within the generated permutations of data, via the computer processor, wherein the index is the starting position of the data file within the generated permutations, such that the input data may be generated at access time; and
  providing the input data in response to the request.

8. The method of claim 7 wherein the input size length and the index persist on the memory, instead of the data file.

9. The method of claim 8 wherein the memory is a disk.

10. The method of claim 9 wherein using the number of bytes and the index to indicate the data file comprises transmitting the number of bytes and the index to a recipient instead of the data file.

11. The method of claim 10 wherein transmitting transmits the bytes and the index over a network.

12. The method of claim 10 wherein transmitting transmits the bytes and the index via a bus.

13. A method of compressing a data file, the method comprising:
  determining the size of the data file using a computer processor, the size comprising the total number of bits of the data file;
  generating a random number, based on the determined size of the data file;
  converting the random number into a random binary string;
  based on the determined size of the data file, generating, in a predetermined order, all possible permutations of data of the size of the data file using the computer processor;
  generating a table, based on the permutations of data of the determined size in the predetermined order;
  locating the random binary string in the table;
  searching through the generated permutations to locate the permutation that matches the data file using the computer processor;
  determining an index of the located permutation;
  storing the size and the index of the located permutation, in a memory coupled to the computer processor;
  upon receiving a request for input data of the data file and using the size and the index of the located permutation, locating the index within the generated permutations of data, via the computer processor, wherein the index is the starting position of the data file within the generated permutations, such that the located input data may be generated at access time; and
  providing the located input data in response to the request.

14. The method of claim 13 where the data file is binary data.

15. The method of claim 13 where the data file is n-ary data.

16. The method of claim 13 where the index is an integer.

17. The method of claim 13 wherein using the size and the index comprises transmitting the size and the index to a recipient.

18. The method of claim 17 wherein transmitting comprises transmitting on a network.

19. The method of claim 17 wherein transmitting comprises transmitting on a bus.

20. The method of claim 13 wherein using the size and the index comprises storing the size and the index.

* * * * *